(12) United States Patent
Rabjohn et al.

(10) Patent No.: US 10,230,335 B2
(45) Date of Patent: Mar. 12, 2019

(54) TEMPERATURE COMPENSATED POWER AMPLIFIER GAIN

(71) Applicant: Skyworks Solutions, Inc., Woburn, MA (US)

(72) Inventors: Gordon Glen Rabjohn, Ottawa (CA); Edward John Wemyss Whittaker, Bishop's Stortford (GB); Grant Darcy Poulin, Carp (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/714,120

(22) Filed: Sep. 25, 2017

(65) Prior Publication Data

US 2018/0115287 A1   Apr. 26, 2018

Related U.S. Application Data

(60) Provisional application No. 62/402,464, filed on Sep. 30, 2016.

(51) Int. Cl.
| | |
|---|---|
| H03F 3/20 | (2006.01) |
| H03F 1/30 | (2006.01) |
| H03G 3/20 | (2006.01) |
| H03F 3/195 | (2006.01) |
| H03F 1/02 | (2006.01) |
| H03F 3/213 | (2006.01) |
| H03G 3/30 | (2006.01) |
| H03F 3/24 | (2006.01) |

(52) U.S. Cl.
CPC .......... *H03F 1/30* (2013.01); *H03F 1/02* (2013.01); *H03F 1/0266* (2013.01); *H03F 3/195* (2013.01); *H03F 3/213* (2013.01); *H03F 3/245* (2013.01); *H03G 3/20* (2013.01); *H03G 3/3042* (2013.01); *H03G 3/3047* (2013.01); *H03F 2200/408* (2013.01); *H03F 2200/447* (2013.01); *H03F 2200/451* (2013.01); *H03F 2200/468* (2013.01); *H03G 2201/708* (2013.01)

(58) Field of Classification Search
CPC ................ H03F 3/20; H03F 1/30; H03G 3/30
USPC ........................................ 330/285, 296, 289
See application file for complete search history.

(56) References Cited

U.S. PATENT DOCUMENTS

| | | | | |
|---|---|---|---|---|
| 5,396,163 | A * | 3/1995 | Nor ....................... | H02J 7/0086 320/159 |
| 5,854,971 | A | 12/1998 | Nagoya | |
| 5,977,826 | A * | 11/1999 | Behan ....................... | H03F 1/30 330/149 |
| 7,026,874 | B2 | 4/2006 | Vaara | |
| 7,898,316 | B2 * | 3/2011 | Pahr ....................... | H04N 3/155 327/512 |
| 9,405,332 | B2 * | 8/2016 | Ichitsubo ................ | G06F 1/181 |
| 10,014,886 | B2 | 7/2018 | Whittaker et al. | |

(Continued)

*Primary Examiner* — Henry Choe
(74) *Attorney, Agent, or Firm* — Knobbe, Martens, Olson & Bear, LLP

(57) ABSTRACT

A temperature compensation circuit comprises a temperature coefficient circuit that generates a temperature coefficient that is temperature dependent and a compensation circuit that generates a compensation signal based on an indication of temperature of an amplifier and the temperature coefficient, and based on the compensation signal, a gain of the amplifier is adjusted to improve amplifier linearity during data bursts.

21 Claims, 11 Drawing Sheets

(56) References Cited

U.S. PATENT DOCUMENTS

| | | | |
|---|---|---|---|
| 2002/0130786 A1* | 9/2002 | Weindorf | G02F 1/133603 340/815.45 |
| 2016/0273959 A1* | 9/2016 | Wang | H01L 31/02027 |
| 2017/0019076 A1* | 1/2017 | Ripley | H03F 3/21 |
| 2017/0194916 A1 | 7/2017 | Whittaker et al. | |

* cited by examiner

TEMPERATURE COMPENSATED POWER AMPLIFIER GAIN

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

WiFi (802.11XX) standards typically assume that a link is stationary and assume that the link budget, and therefore transmitted power, is stable over the length of a burst. Early WiFi systems used only short bursts (e.g., bursts around 200 microseconds) and low modulation complexity, so amplifier stability was not a problem. More recent WiFi standards, such as 802.11AC, allow for longer bursts (for improved throughput), and support 256QAM modulation which call for better amplifier linearity to achieve the specified EVM. Under this standard, excellent amplifier performance is be maintained over a long burst, but an amplifier's gain tends to drop as it warms up.

SUMMARY

This invention addresses the problem of amplifier gain stability over the length of a long burst. Typically, there is a desire to keep the gain of a power amplifier constant within a window of less than 0.2 dB over a 4 millisecond (ms) burst, over all conditions. In some embodiments, the gain of a power amplifier is to be kept constant within a window of less than 0.1 dB over a 4 ms burst. The performance of the transmit chain is therefore becoming more difficult to achieve with more aggressive EVM requirements (e.g., going from about 3% EVM in 802.11A systems to less than 1% EVM in 802.11AC systems), longer bursts (e.g., going from 200 microseconds to up to 4000 microseconds), and increased bandwidth (e.g., going from 20 MHz to 160 MHz).

Advantageously, embodiments of systems and methods for temperature compensated power amplifier gain disclosed herein can be applied to a variety of amplifiers, such as power amplifiers, low noise amplifiers, pulse amplifiers, driver amplifiers, instrumentation amplifiers, gain blocks, or any amplifier needing excellent short-term stability. Further, the embodiments disclosed herein compensate for gain droop experienced by amplifiers that are heating up without the need to know how quickly the temperature of the amplifier is changing (for example, the thermal environment of the amplifier need not be known a priori).

Prior art employs bias networks that provide bias current (quiescent current) proportional to absolute temperature (PTAT) to temperature-compensate an amplifier. PTAT compensation results in an amplifier that has fairly constant gain over temperature, but is under-biased at very low temperatures (with resultant poor linearity), and over-biased at high temperatures (with resultant poor linearity), so optimum bias (therefore optimum linearity) is achieved only in a narrow range of temperatures. In contrast, this invention allows an amplifier to be biased optimally at many temperatures. This invention may be added on to bias schemes, such as PTAT, constant current, elbow bias, or any combination, or any other scheme. Therefore, this invention may be used with a variety of active devices, such as bipolar transistors, FETS, HEMTs, LDMOS transistors, tubes, traveling wave tubes, each of which will have their own biasing needs.

Certain embodiments relate to a power amplifier system comprising a power amplifier configured to amplify a wireless local area network signal, a sampling circuit configured to capture an indication of initial temperature of the power amplifier when the power amplifier is energized, and a temperature compensation circuit configured to generate a compensation signal based on a temperature coefficient that is temperature dependent and an indication of temperature change relative to the initial temperature of the power amplifier, and to cause a gain of the power amplifier to be adjusted based on the compensation signal.

In an embodiment, the indication of the initial temperature is captured just after the power amplifier is energized. In another embodiment, the indication of the initial temperature is stored in a sample-and-hold circuit. In a further embodiment, the temperature compensation circuit includes a multiplier configured to multiply the indication of the temperature change of the power amplifier by the temperature coefficient.

In an embodiment, the temperature compensation circuit is configured to adjust a reference signal based on the compensation signal to provide a bias signal. In another embodiment, the power amplifier is a multi-stage power amplifier, and a first stage of the power amplifier is configured to receive the bias signal to correct for gain drop over time for the power amplifier. In a further embodiment, the sampling circuit is configured to sample a value from a temperature sensor to provide the indication of the initial temperature of the power amplifier. In a yet further embodiment, the temperature sensor includes a diode.

In an embodiment, the temperature compensation circuit includes a temperature coefficient circuit configured to generate the temperature coefficient based on an indication of average temperature of the power amplifier. In another embodiment, the temperature coefficient circuit includes a first digital register and a second digital register, where the temperature coefficient circuit is configured to generate the temperature coefficient based on values in the first digital register and the digital second register. In a further embodiment, the first digital register is configured to store a base coefficient and the second digital register is configured to store a value to set a rate of change of the temperature coefficient over temperature. In a further embodiment, the power amplifier and a temperature sensor are implemented on a first semiconductor die and the temperature compensation circuit is implemented on a second semiconductor die.

In accordance with a number of embodiments, a method of adjusting a gain of a power amplifier is disclosed. The method comprises generating a temperature coefficient based on an indication of average temperature of a power amplifier, storing an indication of initial temperature of the power amplifier when the power amplifier is energized, generating a compensation signal based on the temperature coefficient and an indication of a change in temperature of the power amplifier relative to the initial temperature, and adjusting a gain of the power amplifier based on the compensation signal.

In an embodiment, adjusting the gain includes modifying a reference current based on the compensation signal and generating a bias voltage from the modified reference current, the bias voltage provided to a first stage of the power amplifier, the power amplifier including multiple stages. In another embodiment, generating the compensation signal includes multiplying the temperature coefficient and the indication of the change in the temperature of the power amplifier. In a further embodiment, generating the temperature coefficient includes multiplying the indication of the average temperature by a rate to generate a multiplication result and subtracting the multiplication result from a base temperature coefficient. In a yet further embodiment, the method further comprises capturing the indication of the initial temperature of the power amplifier just after the power amplifier is energized and storing the indication of the initial temperature in a sample and hold circuit.

Certain other embodiments relate to a wireless communication device comprising an antenna configured to transmit an amplified radio frequency signal, and a power amplifier system including a power amplifier configured to provide the amplified radio frequency signal, a sampling circuit configured to capture an indication of initial temperature of the power amplifier when the power amplifier is energized, and a temperature compensation circuit configured to generate a compensation signal based on a temperature coefficient that is temperature dependent and an indication of temperature change relative to the initial temperature of the power amplifier, and to cause a gain of the power amplifier to be adjusted based on the compensation signal.

In an embodiment, the temperature compensation circuit includes a temperature coefficient circuit configured to generate the temperature dependent temperature coefficient based on an indication of average temperature of the power amplifier. In another embodiment, the temperature coefficient circuit includes a first digital register configured to store a base coefficient and a second digital register configured to store a value to set a rate of change of the temperature coefficient over temperature. In a further embodiment, the temperature coefficient circuit further includes a multiplier configured to multiply the indication of average temperature of the power amplifier by the value to generate a multiplication result, and a subtractor configured to subtract the multiplication result from the base coefficient.

In an embodiment, a wireless local area network power amplifier system comprises a power amplifier configured to amplify a wireless local area network signal; and a temperature compensation circuit configured to generate a compensation signal based on a temperature coefficient that is temperature dependent and an indication of temperature of the power amplifier, and to cause a gain of the power amplifier to be adjusted based on the compensation signal.

In an embodiment, the power amplifier is configured to provide a transmission burst of at least 1 millisecond. In an embodiment, the power amplifier is configured to provide a transmission burst of less than 1 millisecond. In an embodiment, the power amplifier is configured to provide a transmission burst of between 1 millisecond and 5 milliseconds. In an embodiment, the temperature compensation circuit includes a multiplier configured to multiply the indication of temperature by the temperature coefficient. In an embodiment, more temperature compensation is provided at a higher temperature than at a lower temperature. In an embodiment, the compensation signal has a linear relationship with temperature. In an embodiment, the compensation signal has a non-linear relationship with temperature. In an embodiment, the temperature compensation circuit includes digital circuitry. In an embodiment, the temperature compensation circuit is configured to adjust a bias signal for the power amplifier based on the compensation signal. In an embodiment, the power amplifier is a multi-stage power amplifier, and a first stage of the power amplifier is configured to receive the bias signal. In an embodiment, the temperature compensation circuit includes a sampling circuit configured to sample a value from a temperature sensor and to provide the indication of temperature of the power amplifier. In an embodiment, the power amplifier and the temperature compensation circuit are implemented on different die. In an embodiment, the power amplifier and the temperature sensor are implemented on a gallium arsenide die and the temperature sensor includes a diode. In an embodiment, the temperature compensation circuit includes a temperature coefficient circuit configured to generate the temperature coefficient based on an indication of temperature. In an embodiment, the temperature coefficient circuit includes a first digital register and a second digital register, the temperature coefficient being configured to generate the temperature coefficient based on values in the first digital register and the digital second register. In an embodiment, the first digital register is configured to store a base coefficient and the second digital register is configured to store a value to set a rate of change of the temperature coefficient over temperature. In an embodiment, the indication of temperature is an indication of average temperature. In an embodiment, the temperature coefficient circuit includes a multiplier and a subtractor, the multiplier and the subtractor being implemented by digital circuitry.

In an embodiment, a method of adjusting a gain of a power amplifier comprises generating a temperature coefficient based on an indication of average temperature; generating a compensation signal based on an indication of temperature of the power amplifier and the temperature coefficient; and adjusting the gain of the power amplifier based on the compensation signal.

In an embodiment, said adjusting includes adjusting a bias provided to the power amplifier. In an embodiment, said adjusting includes adjusting a bias current provided to a first stage of the power amplifier, where the power amplifier includes multiple stages. In an embodiment, said adjusting includes adjusting the attenuation in a variable attenuator in an amplifier. In an embodiment, said generating the compensation signal includes multiplying the temperature coefficient and the indication of temperature of the power amplifier. In an embodiment, said generating the compensation signal is performed using digital circuitry. In an embodiment, said generating the temperature coefficient includes multiplying a measure of average temperature by a rate to generate a multiplication result. In an embodiment, said generating the temperature coefficient further includes subtracting the multiplication result from a base temperature coefficient. In an embodiment, the method is performed in association with a burst of the power amplifier lasting at least 1 millisecond. In an embodiment, the compensation signal has a higher magnitude at a higher temperature than at a lower temperature.

In an embodiment, a temperature compensation circuit comprises a temperature coefficient circuit configured to generate a temperature coefficient that is temperature dependent; and a computation circuit configured to generate a compensation signal based on an indication of temperature of an amplifier and the temperature coefficient, and to cause a gain of the amplifier to be adjusted based on the compensation signal.

In an embodiment, the computation circuit includes a multiplier configured to multiply the indication of temperature by the temperature coefficient. In an embodiment, more temperature compensation is provided at a higher temperature than at a lower temperature. In an embodiment, the compensation signal has a linear relationship with temperature. In an embodiment, the compensation signal has a non-linear relationship with temperature. In an embodiment, the temperature coefficient circuit and the computation circuit each include digital circuits. In an embodiment, the computation circuit is configured to adjust a bias signal for the amplifier based on the compensation signal. In an embodiment, the amplifier is a power amplifier. In an embodiment, the temperature compensation circuit further comprises a sampling circuit configured to sample a value from a temperature sensor and to provide the indication of temperature of the amplifier. In an embodiment, the temperature coefficient circuit includes a first digital register and a second digital register, and the temperature coefficient is configured to generate the temperature coefficient based on values in the first digital register and the digital second register. In an embodiment, the first digital register is configured to store a base coefficient and the second digital register is configured to store a value to set a rate of change of the temperature coefficient over temperature. In an embodiment, the temperature coefficient circuit is configured to generate the temperature coefficient based on an indication of average temperature. In an embodiment, the temperature coefficient circuit includes a multiplier and a subtractor, where the multiplier and the subtractor are implemented by digital circuits.

In an embodiment, a temperature coefficient circuit comprises a multiplier configured to multiply an indication of temperature of an amplifier by a temperature compensation value; and a subtractor configured to subtract a value based on an output of the multiplier from a base compensation value, where the temperature coefficient circuit is configured to provide a temperature dependent temperature coefficient using the multiplier and the subtractor.

In an embodiment, a wireless communication device comprises a power amplifier configured to provide an amplified radio frequency signal; an antenna configured to transmit the amplified radio frequency signal; and a temperature compensation circuit configured to generate a compensation signal based on a temperature dependent temperature coefficient and an indication of temperature of the power amplifier, and to cause a gain of the power amplifier to be adjusted based on the compensation signal.

BRIEF DESCRIPTION OF THE DRAWINGS

Embodiments of this disclosure will be described, by way of non-limiting example, with reference to the accompanying drawings.

DETAILED DESCRIPTION OF CERTAIN EMBODIMENTS

Figure 1:
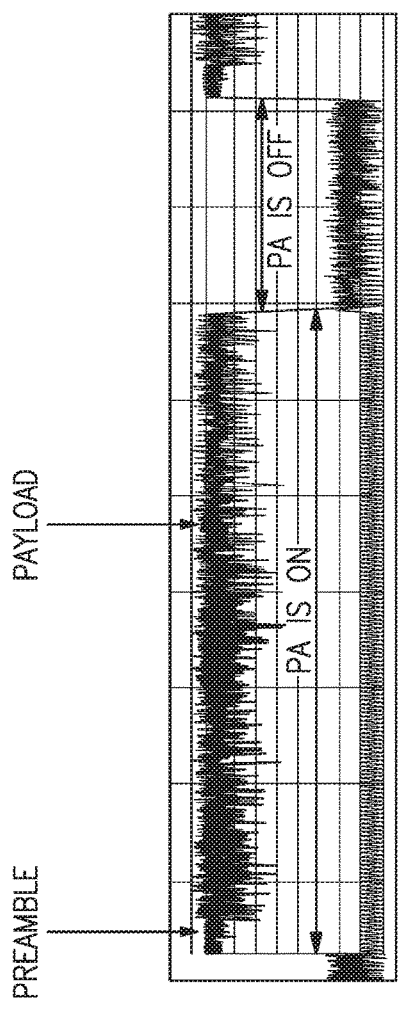
FIG. 1 is a graph that illustrates an example 802.11a transmission burst of a power amplifier.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a graph that illustrates an example 802.11a transmission burst of a power amplifier. Wi-Fi standards use bursts of information, or packets. A demodulation level is typically set at the beginning of the packet. As shown in FIG. 1, a preamble or header is provided at a beginning of a burst. The preamble can be in a range from about 16 microseconds to 60 microseconds long, for example. During the preamble, a level of demodulation is set. During the remaining time the power amplifier is on, the power amplifier transmits a payload that includes data. It is desirable to keep power substantially constant during the payload. After a burst that includes the preamble and the payload, the power amplifier is turned off. The power amplifier can subsequently be turned on and transmit a preamble and a payload in the next burst.

Since the level of modulation is set during the preamble of the burst, any change in system gain over the length of the packet can cause an increase in Error Vector Magnitude (EVM), and ultimately errors. EVM is a measure of the accuracy of a signal. Dynamic Error Vector Magnitude (DEVM) is a measure of EVM of a system that is turned on and turned off with bursts. The dominant cause of DEVM degradation can be the change in amplifier gain over the length of a burst. Since a typical Wi-Fi power amplifier should be powered off between packets, the Wi-Fi power amplifier can still be warming up during transmission of a packet and the gain of the Wi-Fi power amplifier can consequently drift. This drifting gain can impair EVM. Aspects of this disclosure can reduce drift in power amplifier gain caused by thermal effects.

Power amplifiers that include bipolar transistors can also include a current mirror bias circuit. In this situation, the power amplifier current (and therefore the gain) at the beginning of a burst tends to be lower. This can be due to a reference transistor of the current mirror dissipating less power and being smaller than a power amplifier transistor, resulting in a lower steady state temperature of the reference transistor than the power amplifier transistor. While the power amplifier is warming up, such a difference in temperature between the reference transistor and the power amplifier transistor is changing.

Figure 2:
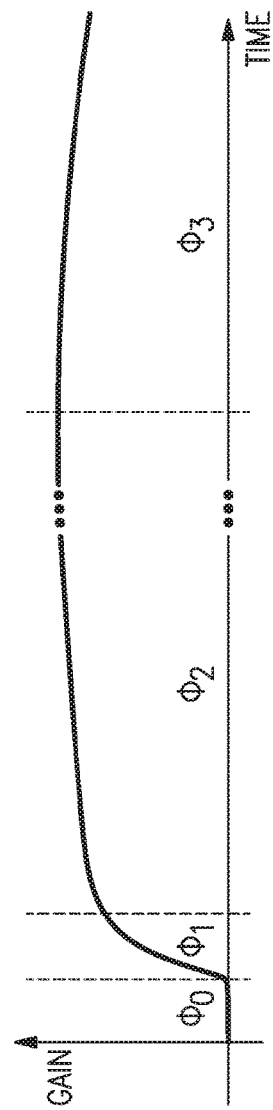
FIG. 2 is a graph of an example of power amplifier gain versus time.

FIG. 2 is a graph of an example of power amplifier gain versus time. The graph includes an initial phase $\Phi_0$, in which the power amplifier is disabled and has a low gain, such as a gain of about 0. After the initial phase $\Phi_0$, the power amplifier is enabled. For example, the end of the initial phase $\Phi_0$ can correspond to a time instance when an enable signal for the power amplifier transitions from a deactivated state to an activated state. As shown in FIG. 2, after being enabled, the power amplifier can operate in multiple phases associated with different gains. For example, the power amplifier can include a first phase $\Phi_1$, in which the power amplifier's gain can begin to settle based on a dominant influencing factor. The first phase I can last for around 10 s of microseconds, such as 50 microseconds, for example. The first phase $\Phi_1$ can be corrected by an RC decay time constant. Additionally, the power amplifier can include a second phase $\Phi_2$ in which gain can further settle and become substantially constant. The second phase $\Phi_2$ can last for 100 s of microseconds, such as around 300 microseconds to 700 microseconds, for example. In a third phase $\Phi_3$, the gain of the power amplifier can droop. This gain droop can occur in a relatively long burst. The graph of FIG. 2 illustrates example phases and may not be to scale. For instance, the third phase $\Phi_3$ can begin at around 500 microseconds, around 800 microseconds, or more into the burst. The third phase $\Phi_3$ can be corrected by an RC decay time constant. The third phase $\Phi_3$ can be several milliseconds, for example. The third phase $\Phi_3$ can last to the end of the burst, up to 5 milliseconds, for example.

In certain applications, a power amplifier can provide amplification after the gain has settled and the gain has begun to droop. For example, the power amplifier may provide amplification during the third phase $\Phi_3$ for a relatively long burst (e.g., 1 millisecond or longer).

One approach to reduce DEVM in Wi-Fi power amplifiers relates to using resistor-capacitor (R-C) networks to force more current into a current mirror of a biasing circuit for the first part of the burst to overcome the gain shortfall. Another approach is to force the reference transistor in the current mirror to track the power amplifier transistor temperature by adding a thermal path between the power amplifier transistor and the reference transistor and/or by running the reference transistor at a higher voltage or current density than the power amplifier transistor. These techniques are typically effective for earlier Wi-Fi standards (such as for 802.11A or 802.11G) where burst lengths were generally less than about 300 microseconds and relatively simple forms of modulation (e.g., 64 QAM) that involved moderate DEVM (~30 dB EVM) were used. However, longer bursts (e.g., up to 5 milliseconds) and/or higher order modulation schemes (e.g., 256QAM and 1024QAM) with better DEVM specifications (e.g., about −35 dB or −42 dB EVM) can encounter problems with such approaches. Furthermore, such approaches have encountered some performance variation over a wide range of operating temperatures.

Yet another approach is related to Proportional to Absolute Temperature (PTAT) source biasing. Such an approach can make gain constant over temperature, but the power amplifier can be over-biased and not linear at higher temperatures and also under-biased and not linear at lower temperatures.

The gain of a power amplifier can change as the power amplifier heats up. A gain droop can be caused by the change in temperature of the power amplifier as it warms up. A temperature of the power amplifier can be measured, and the temperature information can be used to alter the gain of the power amplifier to compensate for the change in temperature. This can cancel out the gain droop. A bias of a stage of the power amplifier stages can be adjusted to cause the gain to be changed. Alternatively or additionally, a voltage controlled attenuator can be implemented in the gain stage. The inventors have recognized that the amount of compensation to cancel gain droop can be temperature dependent. Temperature compensation can be implemented by tracking a temperature change of a power amplifier during a burst. The amount of compensation desired over the burst can depend on the average temperature of the power amplifier.

By measuring the temperature of the power amplifier over the length of a burst, a temperature compensation circuit can adjust the gain of the power amplifier to compensate for the gain change due to thermal effects. The temperature of the power amplifier during the burst can be measured, for example, using an on-chip temperature sensor such as a diode on a power amplifier die. The amount of compensation has been found empirically to depend on the steady-state temperature.

Temperature can be sampled at or near a beginning of a burst. For example, a diode on a power amplifier die can sense a change in temperature. The output of the diode can be sampled about 3 microseconds into the burst, for example. A sampling circuit, such as a circuit including a sample-and-hold circuit or a digital memory element, can save the sampled value. During the rest of the burst, a bias control circuit can control the current (therefore the gain) of one or more stages of the power amplifier to cancel the gain change caused by thermal effects as the amplifier temperature deviates from the sampled value. Alternatively or additionally, a bias control circuit can control a variable attenuator in the amplifier chain of a power amplifier to cancel the gain change caused by thermal effects as the amplifier temperature deviates from the sampled value.

Aspects of this disclosure relate to adjusting gain of a power amplifier to compensate variations in gain caused by thermal effects in a pulsed power amplifier configured to transmit relatively long bursts (e.g., bursts lasting at least 1 ms). A temperature compensation circuit can provide a compensation signal that is based on an indication of power amplifier temperature and a temperature coefficient that is dependent temperature. For instance, a computation circuit can multiply an indication of power amplifier temperature from a sampling circuit by the temperature dependent temperature coefficient. The temperature coefficient can be generated by a temperature coefficient circuit of the temperature compensation circuit. The gain of the power amplifier can be adjusted based on the compensation signal so as to compensate for thermal effects associate with transmitting relatively long bursts. For example, a bias signal provided to a power amplifier can be adjusted so as to adjust the gain of the power amplifier.

The temperature compensation discussed herein can provide temperature compensation to reduce DEVM resulting from temperature variation. Such temperature compensation can track die temperature. Thus, the temperature compensation should work well regardless of burst length and/or duty cycle. In some instances, temperature compensation can be implemented in relatively inexpensive CMOS technology. CMOS technology allows for flexibility for digital and analog design that can be difficult to implement in some other technologies, such as gallium arsenide technology. Any of the coefficients and/or biases discussed here can be trimmed during testing (e.g., at final test) to reduce dependence on process changes. For instance, values can be stored in non-volatile memory during testing.

Temperature compensation in accordance with the principles and advantages discussed herein can enable a power amplifier system to meet −43 dB EVM levels at room temperature, and low temperature, and high temperature. The temperature compensation discussed herein can reduce current consumption and provides better performance relative to some previous DEVM compensation approaches. Compared to some previous approaches, the DEVM compensation discussed herein can improve performance at high temperature without sacrificing room temperature performance.

Figure 3:
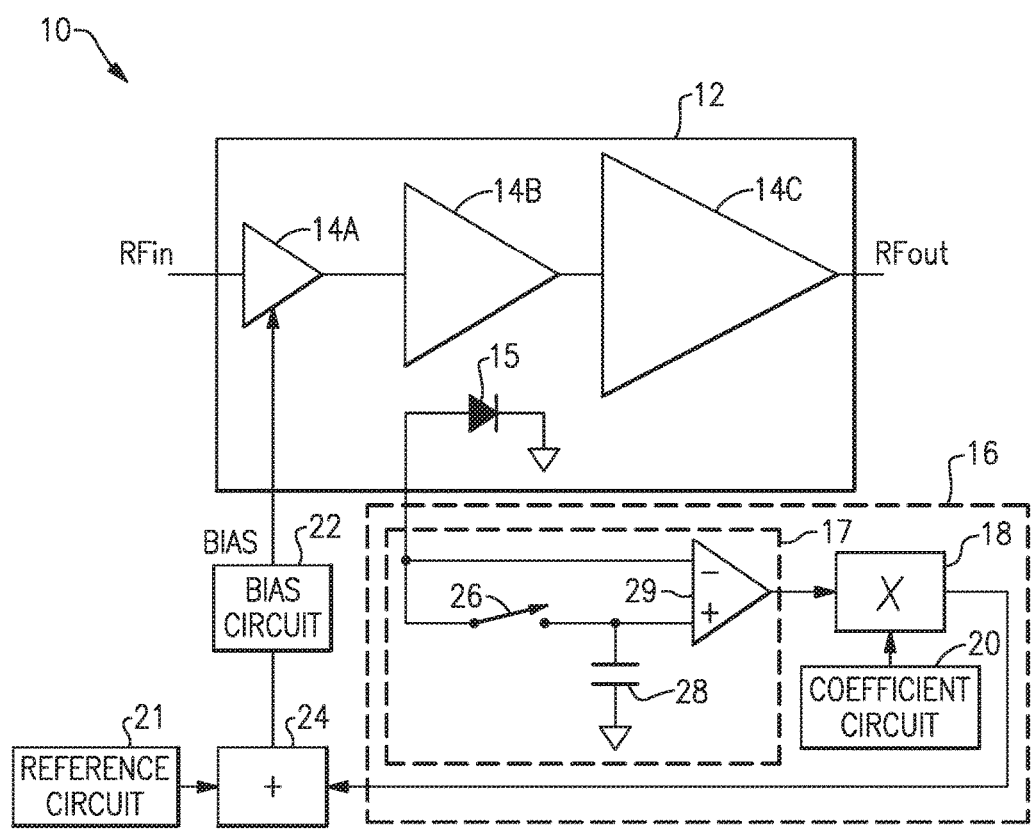
FIG. 3 is a schematic diagram of an illustrative power amplifier system with temperature compensated power amplifier gain according to an embodiment.

FIG. 3 is a schematic diagram of an illustrative power amplifier system 10 with temperature compensated power amplifier gain according to an embodiment. The illustrated power amplifier system 10 includes a power amplifier die 12, a temperature compensation circuit 16, a reference circuit 21, a bias circuit 22, and a combining circuit 24.

The power amplifier die 12 includes a power amplifier with power amplifier stages 14A, 14B, and 14C and a temperature sensor 15. The power amplifier die 12 can be a gallium arsenide die, for example. The power amplifier die 12 includes a power amplifier that can have any suitable number of stages. For example, the illustrated power amplifier has three stages. The power amplifier can receive a radio frequency input signal RFin and a bias signal Bias and provide an amplified radio frequency signal RFout. The gain of the power amplifier can be controlled by the magnitude of the bias signal Bias. The power amplifier can amplify a wireless local area network (WLNA) signal, such as a Wi-Fi signal. Accordingly, the power amplifier can be a pulsed amplifier. The power amplifier can be arranged to provide bursts of at least 1 ms, for example. The temperature sensor 15 can be a diode functioning as a thermometer, for example. The temperature sensor 15 can provide an indication of temperature to a contact (e.g., a pin or a pad) of the power amplifier die 12. The indication of temperature can be indicative of a change in temperature of the power amplifier. The temperature sensor 15 can be located in an environment with radio frequency signals. Accordingly, an interface of the power amplifier die 12 providing an output from the temperature sensor 15 can be arranged to be substantially immune to radio frequency interference. For instance, the temperature sensor 15 can be a diode connected to the temperature compensation circuit 16 by way of a two wire differential circuit having one wire grounded external to the power amplifier die 12. This can prevent a voltage drop on ground on the power amplifier die 12 from causing an error on a voltage provided by a diode voltage of a diode based temperature sensor 15.

The temperature compensation circuit 16 includes a sampling circuit 17, a scaling circuit 18, and a temperature coefficient circuit 20. While the illustrated temperature compensation circuit 16 is external to the power amplifier die 12, a temperature compensation circuit in accordance with any of the principles and advantages discussed herein and a power amplifier can be implemented on a common die in some other instances. The common die can be a silicon-germanium or a silicon die, for example. The sampling circuit 17 can sample a value provided by the temperature sensor 15 at the beginning of a burst. The temperature compensation circuit 16 can cause a current of the first power amplifier stage 14A to be increased relative to the initial current as the power amplifier warms up. As illustrated the sampling circuit 17 includes a switch 26, a capacitor 28, and a difference amplifier 29. The switch 26 and the capacitor 28 can function as a sample-and-hold circuit. The switch 26 can be closed in association with the power amplifier being turned on. The capacitor 28 can be charged to a voltage determined by the temperature of the temperature sensor 15 while the switch 26 is closed. The switch 26 can be opened a relatively short amount of time (e.g., a few microseconds such as about 3 microseconds) after the power amplifier is turned on. This can capture an indication of temperature after the power amplifier has initially stabilized. For example, the indication of temperature can be captured at the beginning of the first phase $\Phi_1$ of FIG. 2. In an embodiment, the sampling circuit 17 can capture the indication of temperature at the transition between the initial phase $\Phi_0$ and the first phase $\Phi_1$. The capacitor 28 can retain its charge for the remainder of the burst. The sample-and-hold circuit can be reset between bursts.

As the temperature of the power amplifier warms up, the voltage of the temperature sensor 15 can decrease. If the voltage of the temperature sensor 15 drops, indicating that the power amplifier has warmed up, after its value is sampled by the sampling circuit 17, there will be a non-zero reference voltage provided by the difference amplifier 29. The output of the difference amplifier 29 can be an indication of instantaneous temperature change of the power amplifier. The output of the difference amplifier 29 is the output of the sampling circuit 17 in FIG. 3.

A computation circuit can compute a compensation signal based on a temperature coefficient and an indication of temperature. The scaling circuit 18 is an example of such a computation circuit. The scaling circuit 18 can multiply the output of the difference amplifier 29 by a temperature coefficient provided by the temperature coefficient circuit 20 to generate a compensation signal. The scaling circuit 18 can track an indication of temperature of the power amplifier during a burst and multiply the indication of temperature of the power amplifier by a temperature coefficient to generate a compensation signal for adjusting power amplifier current and thereby power amplifier gain. The temperature coefficient is temperature dependent. Embodiments of the temperature coefficient circuit 20 will be described with reference to FIGS. 4 and 6.

The reference circuit 21 generates a reference current. The reference current is modified by combining circuit 24 and the compensation signal to correct for gain drop over time for the power amplifier 12. In an embodiment, the reference circuit 21 comprises a constant voltage source and a resistor where the voltage from the constant voltage source is dropped across the resistor to generate the reference current. For example, the constant voltage source can be a bandgap reference. In another embodiment, the reference circuit comprises a constant current source which generates the reference current.

The combining circuit 24 can combine (e.g., add) an output of the reference circuit 21 with the compensation signal from the temperature compensation circuit 16. In an embodiment, the combiner 24 can be a summing circuit. In another embodiment, the combiner 24 can be integrated into the reference circuit 21.

The bias circuit 22 receives the output of the combining circuit 24 and generates a bias signal Bias for the power amplifier 12. The bias circuit 22 is configured to receive a current input and output a signal that is applied to the power amplifier 12. For example, the bias signal Bias can be applied to the base of the amplifier transistor of the amplifier stage 14A. In an embodiment, the bias circuit 22 comprises a current mirror. In an embodiment, the bias circuit 22 is constructed on the same die as the power amplifier 12 so that its characteristics due to process track the characteristics due to process of the amplifier that the bias circuit 22 is controlling. In an embodiment, the bias signal Bias is dependent on one or more of process, temperature, and RF power. As is known to one of skill in the art of electrical circuitry, the bias signal Bias can be converted between a voltage and a current signal.

The bias signal Bias can be provided to a first stage of the power amplifier as illustrated. A bias signal for any suitable power amplifier stage can be adjusted in accordance with any of the principles and advantages discussed herein. In some applications, bias signals for two or more stages can be adjusted in accordance with any of the principles and advantages discussed herein.

In some embodiments, the temperature compensation circuit 16, the reference circuit 21, the bias circuit 22, and the combining circuit 24 can be implemented on a common die. The common die can be a silicon die. The common die can be a complementary semiconductor metal oxide die. According to some other embodiments, any suitable portion of the temperature compensation circuit 16, the bias circuit 22, and/or the combining circuit 24 can be implemented on a common die.

In another embodiment, the reference circuit 21 is constructed on another die than the die that includes the power amplifier 12. For example, the power amplifier 12 and the bias circuit 22 are constructed on a GaAs die and the reference circuit 21 is constructed on a silicon die.

Long word gain compensation can account for gain drop caused by the entire power amplifier warming up during relatively long bursts (e.g., bursts of at least 1 ms). The power amplifier temperature can be monitored by a temperature sensor, such as the temperature sensor 15 of FIG. 3. The temperature sensor 15 can be a diode on a gallium arsenide die acting as a thermometer, for example. Long word gain compensation can advantageously compensate for gain droop for bursts of 1 ms to 5 ms long.

A bias current provided to the first stage of a power amplifier can be represented by Equation 1:

$$I_{OB1} = I_O(1 + k_T(V_{d0} - V_d))$$ (Equation 1)

In Equation 1, $I_{OB1}$ can represent a bias current for a first stage of a power amplifier (e.g., current provided to power amplifier stage 14A in FIG. 3), $I_O$ can represent a starting current (e.g., the current output from the reference circuit 21), $k_T$ can represent a temperature coefficient, $V_{d0}$ can represent a diode voltage at a beginning of a burst (e.g., a voltage from the temperature sensor 15 held on the capacitor 28 in FIG. 3), and $V_d$ can represent a diode voltage (e.g., a voltage from the temperature sensor 15 provided to the inverting terminal of the difference amplifier 29 in FIG. 3). In Equation 1, the term $V_{d0} - V_d$ can be replaced by 0 if $V_{d0} - V_d$ is negative so as to not decrease the bias current. It has been observed that more compensation is needed at relatively hot temperatures (e.g., 85° C.) and relatively little compensation is needed at relatively cold temperatures (e.g., −10° C.). This can be accomplished by modifying the value of $k_T$.

Measurements indicate that the gain can drop can be in a range from about 0.2 dB to 0.4 dB over a relatively long burst. A change of 10-15% in bias current for a first power amplifier stage can cause approximately 0.3 dB change in power amplifier gain. A temperature sensor that includes two diodes in series can measure about 15 mV of voltage change on the diodes over the length of a burst. The voltage change can be expected to change by less than about 10 mV in certain applications. A voltage change of about 7.5 mV can result in about 7% change in current for the first power amplifier stage. As an example, $k_T$ can be about 1% per mV.

While FIG. 3 illustrates an example power amplifier system 10 that can implement temperature compensated power amplifier biasing in accordance with Equation 1, any suitable circuit arranged to implement Equation 1 or a similar equation can alternatively be implemented. Such a circuit can be implemented with analog circuits, digital circuits, or any suitable combination thereof.

The temperature coefficient $k_T$ of Equation 1 can be dependent on temperature. Measurements indicate that more compensation is desired at hot temperature than at room temperature. The temperature coefficient $k_T$ can be varied and/or optimized. The amount of temperature compensation to compensate for gain droop can be dependent on average temperature. Accordingly, a temperature coefficient circuit can generate temperature coefficient $k_T$ that is dependent on temperature. The temperature coefficient circuit can implement Equation 2:

$$k_T = k_{T0} - (85 - \text{Temp}) * k_{TEMPCO},$$ (Equation 2)

where $k_T \geq 0$

In Equation 2, $k_T$ can represent a temperature coefficient, $k_{T0}$ can represent a base temperature coefficient, 85 can represent as a high temperature value where $k_T$ is set to $k_{T0}$ when temperature is at least 85° C., Temp can represent an average temperature in degrees Celsius, and $k_{TEMPCO}$ can represent a rate at which the temperature coefficient value $k_T$ changes with a change in temperature.

The temperature coefficient $k_T$ can determine how much boost current is provided to a power amplifier to increase gain as the power amplifier warms up. With the temperature coefficient $k_T$ set to 0, there is no increase in current provided to the power amplifier and therefore no increase in gain. With temperature coefficient $k_T$ set to a relatively large number, power amplifier current can be increased significantly as temperature rises. The value of the temperature coefficient $k_T$ is dependent on average temperature in accordance with embodiments discussed herein.

The temperature coefficient $k_T$ can be the base temperature coefficient $k_{T0}$ at relatively hot average temperature. For instance, in Equation 2, the temperature coefficient $k_T$ is set to the base temperature coefficient $k_{T0}$ at temperatures of 85° C. or higher. If the rate $k_{TEMPCO}$ at which the temperature coefficient $k_T$ changes with temperature is 0, the temperature coefficient $k_T$ is constant with temperature. The rate $k_{TEMPCO}$ at which the temperature coefficient $k_T$ changes with temperature can be positive such that the temperature coefficient $k_T$ drops as average temperature drops from hot to cold.

Figure 4:
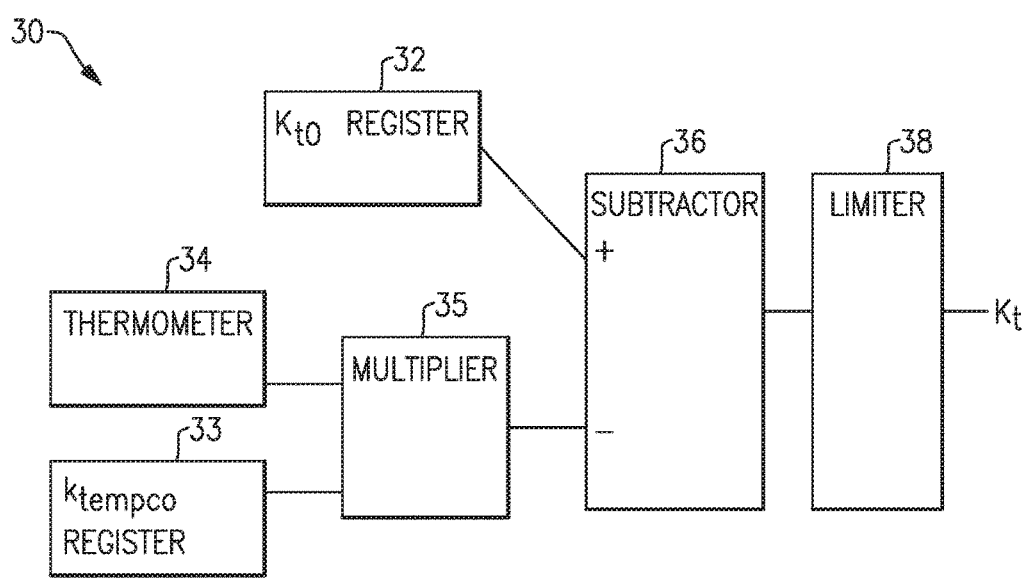
FIG. 4 is a schematic block diagram of a temperature coefficient circuit according to an embodiment.

Any suitable analog circuitry, digital circuitry, or combined analog and digital circuitry can implement Equation 2 or a similar equation to generate a temperature coefficient. FIGS. 4 and 6 illustrate example temperature coefficient circuits that can generate a temperature coefficient in accordance with Equation 2. These example temperature coefficient circuits are digital circuits. Some other temperature coefficient circuits can be implemented using one or more lookup tables, an arithmetic logic unit, a DSP such as a programmable DSP, analog circuit elements such as multipliers and adders, the like, or any combination thereof.

FIG. 4 is a schematic block diagram of a temperature coefficient circuit 30 according to an embodiment. The illustrated temperature coefficient circuit 30 includes a first register 32, a second register 33, a thermometer 34, a multiplier 35, a subtractor 36, and a limiter 38. The temperature coefficient circuit 30 can be implemented by any suitable digital circuits. Any suitable circuit can feed digital data into the first register 32 and/or the second register 33. For example, non-volatile storage elements, such as fuseable elements, can be used to make the contents of the first register 32 and/or the second register 33 fixed.

The first register 32 can store the base temperature coefficient $k_{T0}$. The base temperature coefficient $k_{T0}$ can be any suitable value, such as a 4-bit word. The base temperature coefficient $k_{T0}$ can represent, for example, a proportionality value between a diode voltage and power amplifier current. For instance, the base temperature coefficient $k_{T0}$ can represent the proportionality value between the temperature sensor 15 of FIG. 3 and a current of the power amplifier of FIG. 3.

The second register 33 can store a rate $k_{TEMPCO}$ at which the temperature coefficient $k_T$ changes with temperature. The rate $k_{TEMPCO}$ can be any suitable value, such as a 3-bit word. There can be no compensation for a minimum value for the rate $k_{TEMPCO}$ rate and maximum compensation for a maximum value for the rate $k_{TEMPCO}$.

The thermometer 34 can provide an output representative of an average temperature. The output of the thermometer 34 can be any suitable value, such as a 3-bit word. As an example, the output of the thermometer 34 can represent an average temperature between −40° C. and 85° C. In some implementations, lower output values can represent higher average temperature and higher output values can represent lower average temperature. The thermometer 34 can be on a controller die that is separate from a power amplifier die such that the output of the thermometer 34 can track an average temperature of the power amplifier but not follow the instantaneous temperature of the power amplifier as it warm up and cools down because of the power fluctuations within the RF envelope or the pulsed nature of the RF bursts.

The multiplier 35 can multiply outputs of the second register 33 and the thermometer 34. In some instances, the multiplier 35 can drop one or more bits from the multiplication result. For example, the multiplier 35 can provide a multiplication result without the least significant bit to the subtractor 36. By dropping the least significant bit, the multiplication result can be effectively divided by 2.

The subtractor 36 can subtract an output of the first register 32 from an output of the multiplier 35. The subtractor 36 can be implemented by any suitable digital circuit. The output of the subtractor 36 can be provided to the limiter 38. When the output of the subtractor 36 is positive, the limiter 38 can output the output of the subtractor 36 as the temperature coefficient $k_T$. The limiter 38 can output zero if the output of the subtractor is negative. This can prevent the temperature coefficient circuit 30 from providing a negative value that would reduce a gain of a power amplifier.

FIGS. 5A, 5B, 5C, and 5D are graphs of temperature compensation values associated with the temperature coefficient circuit of FIG. 4. These graphs show relationships temperature coefficients $K_T$ over temperature for various rates $k_{TEMPCO}$ at which the temperature coefficient $k_T$ changes with temperature. Each of these graphs corresponds to a different base temperature coefficient $k_{T0}$. In particular, the base temperature coefficient $k_{T0}$ is 15 in FIG. 5A, 10 in FIG. 5B, 5 in FIG. 5C, and 2 in FIG. 5D. The different lines in these graphs represent different values for the rate $k_{TEMPCO}$. Temperature can be measured on a controller die concurrently with sampling an instantaneous temperature of a power amplifier.

As shown in these graphs, with the rate $k_{TEMPCO}$ being zero, the temperature coefficient $k_T$ is the base temperature coefficient $k_{T0}$ independent of temperature. These graphs also show that the temperature coefficient $k_T$ is the base temperature coefficient $k_{T0}$ at a high temperature (e.g., 85° C. in accordance with Equation 2) independent of the rate $k_{TEMPCO}$. Generally, at lower temperatures, the temperature coefficient $k_T$ drops. For instance, in the graph of FIG. 5A, the temperature coefficient $k_T$ is 0 for rate $k_{TEMPCO}$ of 4 at −40° C.

Figure 5A:
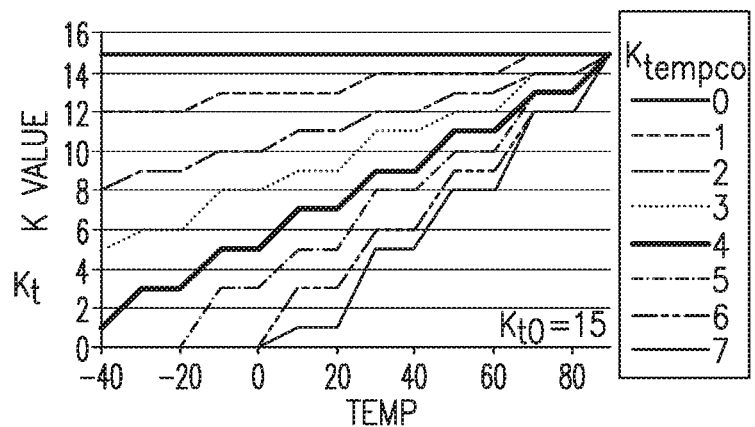
FIGS. 5A, 5B, 5C, and 5D are graphs of temperature compensation values associated with the temperature coefficient circuit of FIG. 4.
Figure 5B:
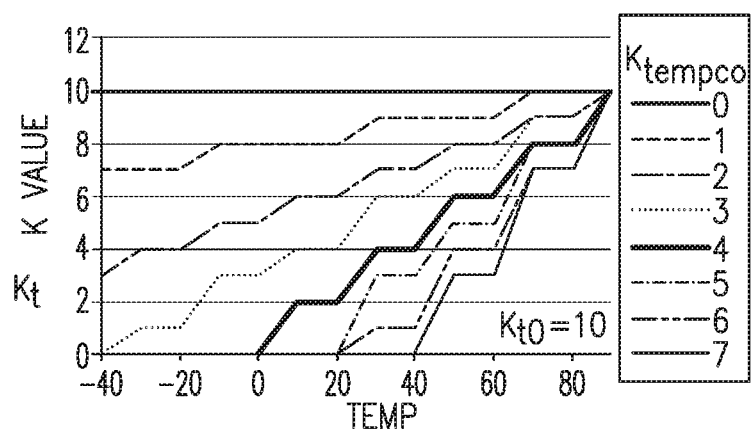
Figure 5C:
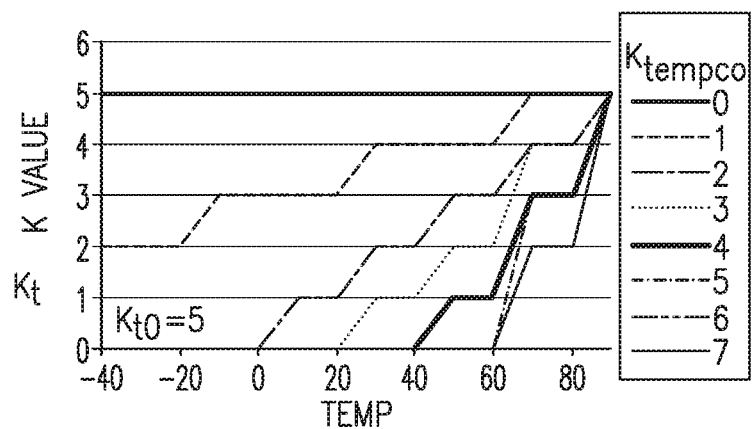
Figure 5D:
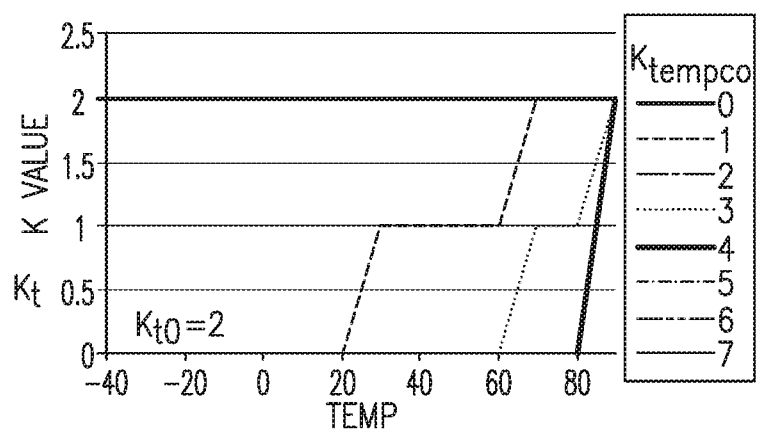

The resolution can be limited at lower values of the base temperature coefficient $k_{T0}$, such as when the base temperature coefficient $k_{T0}$ is 2 as shown in FIG. 5B. This can be acceptable because less compensation can be desired in such circumstances. Better resolution of the temperature coefficient $k_T$ at lower rate $k_{TEMPCO}$ values can be achieved by the temperature coefficient circuit of FIG. 6A as compared to the temperature coefficient circuit of FIG. 4.

Figure 6A:
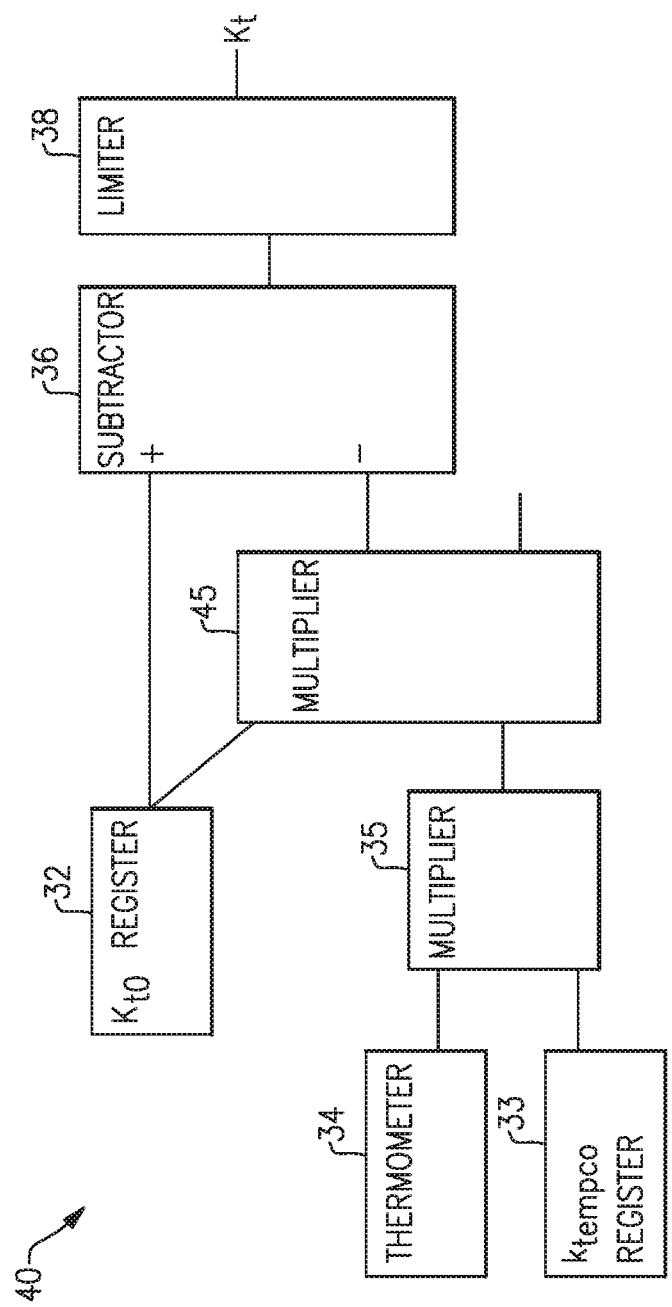
FIG. 6A is a schematic diagram of a temperature coefficient circuit according to another embodiment.

FIG. 6A is a schematic block diagram of a temperature coefficient circuit 40 according to an embodiment. The temperature coefficient circuit 40 is similar to the temperature compensation circuit 30 of FIG. 4 except that a second multiplier 45 is included. The second multiplier 45 can multiply an output of the multiplier 35 by the base temperature compensation value $k_{T0}$ from the first register 32. As illustrated, the second multiplier 45 can receive all of the bits output from the multiplier 35. The second multiplier 45 can drop one or more bits from its multiplication result. For example, the second multiplier 55 can provide a multiplication result without the four least significant bits to the subtractor 36. By dropping the four least significant bits, the multiplication result can be effectively divided by 16. The subtractor 36 can subtract the multiplication result of the second multiplier 45 from the base temperature coefficient $k_{T0}$. With the second multiplier 45, the temperature coefficient circuit 40 can provide better resolution than the temperature coefficient circuit 30 of FIG. 4 for relatively low rate $k_{TEMPCO}$ values (e.g., 2).

In some instances, a power amplifier arranged to transmit a relatively long data burst can be integrated with the transceiver. For instance, a relatively low cost smartphone can include such a power amplifier integrated with a transceiver. The integrated power amplifier and transceiver can be an all CMOS solution. Such a power amplifier can suffer a gain loss during an extended data burst. A digital signal processor (DSP), such as a programmable DSP, can implement any suitable principles and advantages of the temperatures coefficient circuits and/or temperature compensation circuits discussed herein. The DSP can be implemented in a microcontroller of a transceiver that is integrated with a power amplifier. Alternatively or additionally, one or more lookup tables can be implemented in place of a multiplier and/or other circuitry in a temperature coefficient circuit and/or a temperature compensation circuit in accordance with any suitable principles and advantages discussed herein.

Figure 6B:
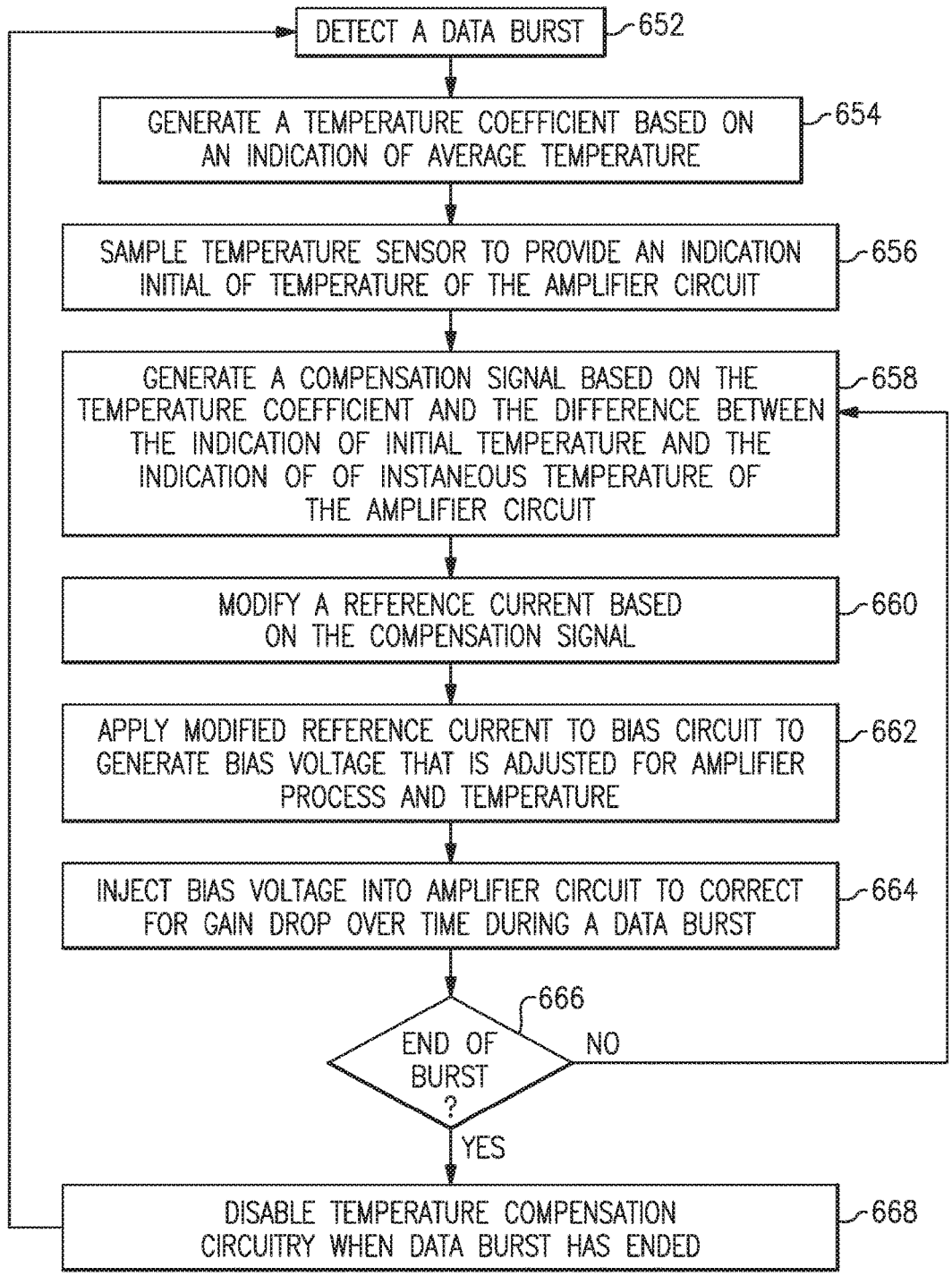
FIG. 6B is an exemplary flowchart illustrating a method of operating bias circuitry during a data burst, according to an embodiment.

FIG. 6B is a flowchart representation of a method 650 of operation during a data burst in accordance with some implementations. In some implementations, the method 650 is performed by a controller associated with the temperature compensation circuit 16. In some implementations, the method 650 is performed by a CMOS (complementary metal-oxide semiconductor) controller (e.g., when a GaAs power amplifier (PA) is used). While pertinent features are shown, those of ordinary skill in the art will appreciate from the disclosure herein that various other features have not been illustrated for the sake of brevity and so as not to obscure more pertinent aspects of the example implementations disclosed herein.

To that end, briefly, in some circumstances, the method 650 includes: detecting a data burst, generating a temperature coefficient, generating a compensation signal based on the temperature of the power amplifier and the temperature coefficient, modifying a reference current based on the compensation signal, generating a bias signal by applying the modified reference current to a bias circuit, applying the bias signal to the power amplifier, and disabling the temperature compensation circuitry according to a determination that the data burst has ended.

At step 652, the method 650 includes detecting a data burst. For example, with reference to FIG. 9, the processor 94 detects the initiation of a quadrature amplitude modulation (QAM) data burst by the transceiver 93.

At step 654, the method 650 generates a temperature coefficient based on an indication of temperature. In an embodiment, the indication of temperature is an indication of average temperature. In an embodiment, generating the temperature coefficient includes multiplying a measure of average temperature by a rate of change of the temperature coefficient over temperature to generate a multiplication result. In an embodiment, generating the temperature coefficient further includes subtracting the multiplication result from a base temperature coefficient. In an embodiment, a first digital register stores the base temperature coefficient and a second digital register stores a value to set the rate of change of the temperature coefficient over temperature.

At step 656, the method 650 samples a value from a temperature sensor to provide the indication of the initial temperature of the power amplifier.

At step 658, the method 650 generates a compensation signal based on the difference between the initial temperature and the indication of temperature of the power amplifier and the temperature coefficient. In an embodiment, generating the compensation signal includes multiplying the temperature coefficient and the indication of temperature of the power amplifier.

At step 660, the method 650 modifies a reference current based on the compensation signal. In an embodiment, modifying the reference current comprises multiplying the reference current, the temperature coefficient and a value indicative of the change in temperature of the power amplifier during the burst and adding the product of the multiplication to the reference current.

At step 662, the method 650 applies the modified reference current to the bias circuit to generate the bias signal for the power amplifier. In an embodiment, the bias signal has been adjusted for temperature change of the amplifier during the data burst. In another embodiment, the bias signal has been adjusted for both process and temperature change of the power amplifier.

At step 664, the method 650 applies the bias signal Bias (e.g., the bias voltage or bias current) to the power amplifier to adjust the gain of the power amplifier. In an embodiment, applying bias signal comprises applying the bias signal to a first stage of the power amplifier, where the power amplifier includes multiple stages.

At step 666, the method 650 determines whether the data burst has ended. If the data burst has not ended, the process 650 moves to step 658. Steps 658-664 are repeated until the data burst has ended. When the data burst has ended, the process 650 moves to step 668.

At step 668, the method 650 disables the temperature compensation circuitry based on a determination that the data burst has ended. For example, with reference to FIGS. 3 and 9, the processor 94 disables the temperature compensation circuit 16 according to a determination that the transceiver 93 has ended the data burst. In one example, the processor 94 disables the temperature compensation circuit 16 by setting the output of the coefficient circuit 20 to zero.

According to some implementations, the temperature compensation circuit 16 or a controller associated therewith waits until a subsequent data burst is detected at step 652 before repeating steps 654-668.

Figure 7:
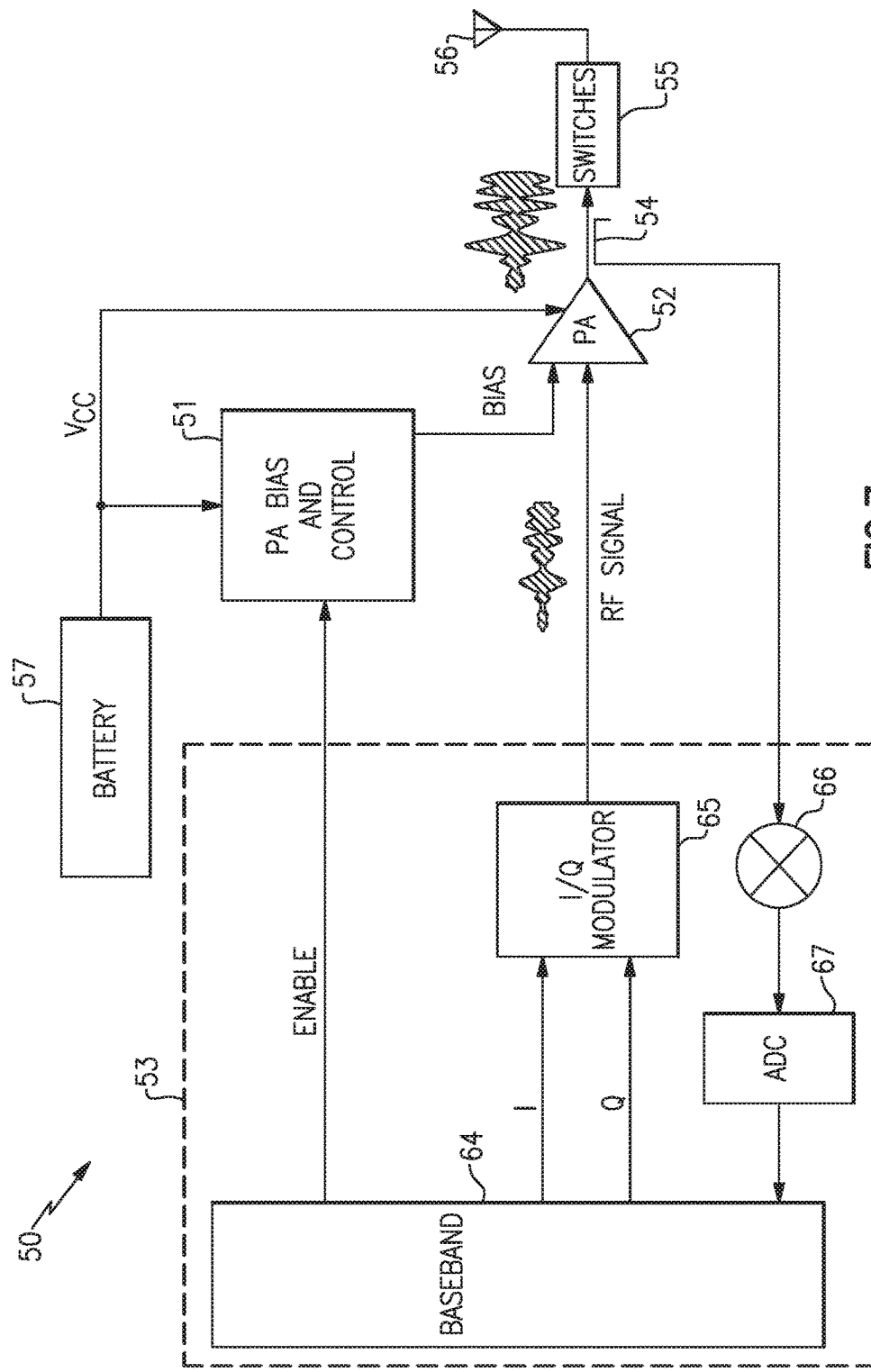
FIG. 7 is a schematic diagram of an example electronic system that includes power amplifier configured to receive a temperature compensated bias signal according to an embodiment.

FIG. 7 is a schematic diagram of an example electronic system 50 that includes power amplifier 52 configured to receive a temperature compensated bias signal according to an embodiment. The illustrated electronic system 50 includes a power amplifier bias and control circuit 51, a power amplifier 52, a transceiver 53, a directional coupler 54, a switch module 55, an antenna 56, a battery 57. The illustrated transceiver 53 includes a baseband processor 64, an I/Q modulator 65, a mixer 66, and an analog-to-digital converter (ADC) 67.

The baseband signal processor 64 can generate an I signal and a Q signal, which can be used to represent a sinusoidal wave or signal of a desired amplitude, frequency, and phase. For example, the I signal can represent an in-phase component of the sinusoidal wave and the Q signal can represent a quadrature component of the sinusoidal wave, which can be an equivalent representation of the sinusoidal wave. In certain implementations, the I and Q signals can be provided to the I/Q modulator 65 in a digital format. The baseband processor 64 can be any suitable processor configured to process a baseband signal. For instance, the baseband processor 64 can include a digital signal processor, a microprocessor, a programmable core, or any combination thereof. Moreover, in some implementations, two or more baseband processors 64 can be included in the electronic system 50.

The I/Q modulator 65 can be configured to receive the I and Q signals from the baseband processor 64 and to process the I and Q signals to generate a RF signal. For example, the I/Q modulator 65 can include digital-to-analog converters (DACs) configured to convert the I and Q signals into an analog format, mixers for upconverting the I and Q signals to radio frequency, and a signal combiner for combining the upconverted I and Q signals into a RF signal suitable for amplification by the power amplifier 52. In certain implementations, the I/Q modulator 65 can include one or more filters configured to filter frequency content of signals processed therein.

The power amplifier bias and control circuit 51 can receive an enable signal ENABLE from the baseband processor 64 and a battery or power high voltage $V_{CC}$ from the battery 57. The power amplifier bias and control circuit can generate a bias signal BIAS for the power amplifier 52 based on the enable signal ENABLE. The power amplifier bias and control circuit 51 can also include circuitry configured to perform dynamic error vector magnitude compensation in accordance with any of the principles and advantages discussed herein. For instance, the bias and control circuit 51 can compensate for changes in gain of the power amplifier 52 over temperature during a relatively long burst. The bias and control circuit 51 can include the temperature compensation circuit 16, the bias circuit 22, and the combining circuit 24 of FIG. 3, for example. The bias and control circuit 51 can include a temperature coefficient circuit, such as the temperature coefficient circuit 30 of FIG. 4 or the temperature coefficient circuit 40 of FIG. 6A.

Although FIG. 7 illustrates the battery 57 directly generating the power high voltage $V_{CC}$, in certain implementations the power high voltage $V_{CC}$ can be a regulated voltage generated by a regulator that is electrically powered using the battery 57. The power amplifier 52 can receive the RF signal from the I/Q modulator 65 of the transceiver 53, and can provide an amplified RF signal to the antenna 56 through the switch module 55.

The directional coupler 54 can be positioned between the output of the power amplifier 52 and the input of the switch module 55, thereby allowing an output power measurement of the power amplifier 52 that does not include insertion loss of the switch module 55. The directional coupler 54 can be positioned at a different point in the electronic system 50 in some other instances. The sensed output signal from the directional coupler 54 can be provided to the mixer 66, which can multiply the sensed output signal by a reference signal of a controlled frequency so as to downshift the frequency content of the sensed output signal to generate a downshifted signal. The downshifted signal can be provided to the ADC 67, which can convert the downshifted signal to a digital format suitable for processing by the baseband processor 64. By including a feedback path between the output of the power amplifier 52 and the baseband processor 64, the baseband processor 64 can be configured to dynamically adjust the I and Q signals to optimize the operation of the electronic system 50. For example, configuring the electronic system 50 in this manner can aid in controlling the power added efficiency (PAE) and/or linearity of the power amplifier 52.

Figure 8A:
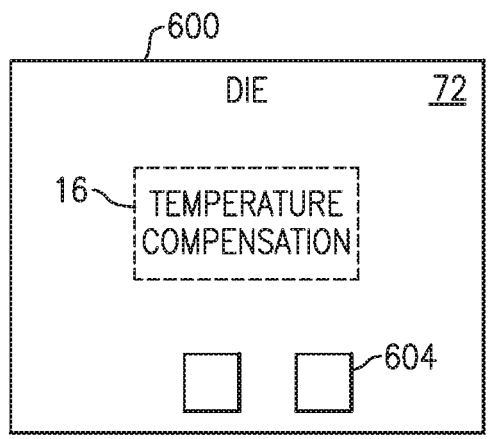
FIGS. 8A-8C are block diagrams of exemplary integrated circuits that include a bias circuit that provides bias control during data bursts, according to certain embodiments.
Figure 8B:
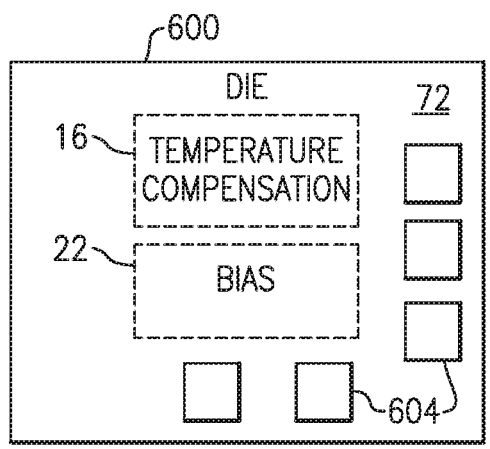
Figure 8C:
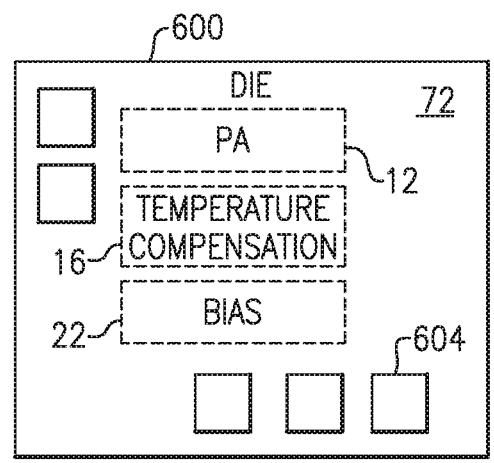

FIGS. 8A-8C are block diagrams of various integrated circuits (ICs) according to some implementations. While some example features are illustrated, those skilled in the art will appreciate from the disclosure herein that various other features have not been illustrated for the sake of brevity and so as not to obscure more pertinent aspects of the example implementations disclosed herein. To that end, for example, FIG. 8A shows that in some implementations, some or all portions of the temperature compensation circuit 16, which operates during data bursts, can be part of a semiconductor die 600. By way of an example, the temperature compensation circuit 16 can be formed on a substrate 72 of the die 600. A plurality of connection pads 604 can also be formed on the substrate 72 to facilitate functionalities associated with some or all portions of the temperature compensation circuit 16.

FIG. 8B shows that in some implementations, a semiconductor die 600 having a substrate 72 can include some or all portions of the temperature compensation circuit 16 and some or all portions of the bias circuit 22, which operates during normal operations according to conventional power amplifier (PA) biasing techniques. A plurality of connection pads 604 can also be formed on the substrate 72 to facilitate functionalities associated with some or all portions of the temperature compensation circuit 16 and some or all portions of the bias circuit 22.

FIG. 8C shows that in some implementations, a semiconductor die 600 having a substrate 72 can include some or all portions of the temperature compensation circuit 16, some or all portions of the bias circuit 22, and some or all portions of the power amplifier (PA) 12. A plurality of connection pads 604 can also be formed on the substrate 72 to facilitate functionalities associated with some or all portions of the temperature compensation circuit 16, some or all portions of the bias circuit 22, and some or all portions of the PA 12. In an embodiment, die 600 is a SiGe die integrating the PA 12 and a controller that includes the temperature compensation circuit 16 and bias circuit 22.

Figure 8D:
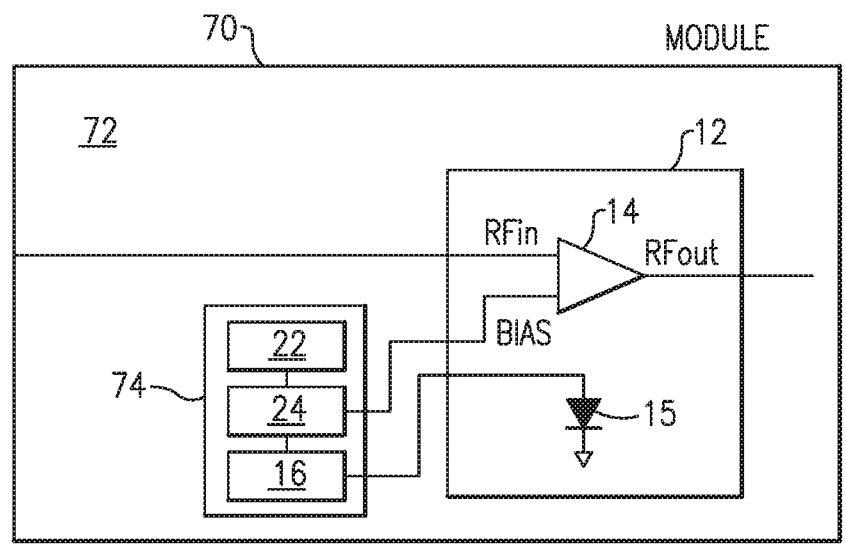
FIGS. 8D-8E are block diagrams of modules that include a power amplifier arranged to receive temperature compensated bias according to certain embodiments.

FIG. 8D is a block diagram of a packaged module 70 that includes a power amplifier arranged to receive temperature compensated bias according to an embodiment. The illustrated packaged module 70 includes a packaging substrate 72, a power amplifier die 12, and a controller die 74. The power amplifier die 12 includes a power amplifier 14 and a temperature sensor 15. The power amplifier die 12 can be gallium arsenide die, for example. The controller die 74 includes a temperature compensation circuit 16, a bias circuit 22, and a combining circuit 24. The controller die 74 can be a CMOS die, for example. The packaging substrate 72 can be a laminate substrate, for example. The power amplifier die 12 and the controller die 74 can be disposed on the packaging substrate 72.

Figure 8E:
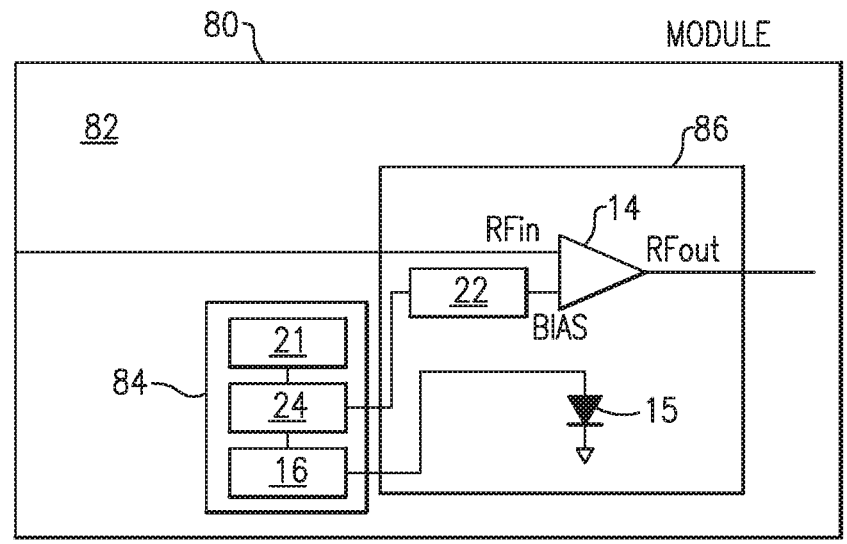

FIG. 8E is a block diagram of a packaged module 80 that includes a power amplifier arranged to receive temperature compensated bias according to an embodiment. The illustrated packaged module 80 includes a packaging substrate 82, a power amplifier die 86, and a controller die 84. The power amplifier die 84 includes a power amplifier 14, a temperature sensor 15, and a bias circuit 22. The power amplifier die 86 can be gallium arsenide die, for example. The controller die 84 includes a temperature compensation circuit 16, a reference circuit 21, and a combining circuit 24. The controller die 84 can be a CMOS die, for example. The packaging substrate 82 can be a laminate substrate, for example. The power amplifier die 86 and the controller die 84 can be disposed on the packaging substrate 82.

Figure 9:
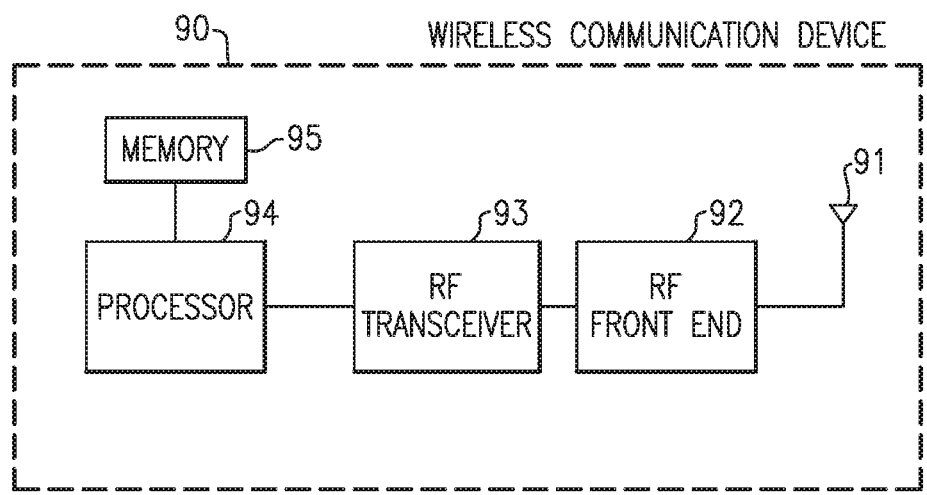
FIG. 9 is a block diagram of a wireless communication device that includes temperature compensated power amplifier biasing to an embodiment.

FIG. 9 is a block diagram of a wireless communication device 90 that includes temperature compensated power amplifier biasing to an embodiment. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 93, a processor 94, and a memory 95. The antenna 91 can transmit RF signals provided by the RF front end 92. The antenna 91 can transmit carrier aggregated signals provided by the RF front end 92. The antenna 91 can provide received RF signals to the RF front end 92 for processing.

The RF front end 92 can include one or more power amplifiers, one or more low noise amplifiers, RF switches, receive filters, transmit filters, duplex filters, or any combination thereof. The RF front end 92 can transmit and receive RF signals associated with any suitable communication standards. For instance, the RF front end 92 can provide a carrier aggregated signal to the antenna 91. The temperature compensation discussed herein can adjust a gain of a power amplifier of the RF front end 92. The RF front end 92 can include a temperature compensation circuit that includes a temperature coefficient circuit arranged to provide a temperature dependent temperature coefficient.

The RF transceiver 93 can provide RF signals to the RF front end 92 for amplification and/or other processing. The RF transceiver 93 can also process an RF signal provided by a low noise amplifier of the RF front end 92.

The RF transceiver 93 is in communication with the processor 94. The processor 94 can be a baseband processor. The processor 94 can provide any suitable base band processing functions for the wireless communication device 90. The memory 95 can be accessed by the processor 94. The memory 95 can store any suitable data for the wireless communication device 90.

Any of the principles and advantages discussed herein can be applied to other systems, not just to the systems described above. The elements and operations of the various embodiments described above can be combined to provide further embodiments. Some of the embodiments described above have provided examples in connection with power amplifiers, packaged modules, and/or wireless communications devices. However, the principles and advantages of the embodiments can be used in connection with any other systems, apparatus, or methods that benefit could from any of the teachings herein. For instance, any of the principles and advantages discussed herein can be implemented in connection with providing temperature compensation for an amplifier that experiences changes in gain over temperature. Any of the principles and advantages discussed herein can be implemented in association with a wireless local area network (WLAN) power amplifier. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A power amplifier system comprising:
a power amplifier configured to amplify a wireless local area network signal;
a sampling circuit configured to capture an indication of initial temperature of the power amplifier when the power amplifier is energized, and
a temperature compensation circuit configured to generate a compensation signal based on a temperature coefficient that is temperature dependent and an indication of temperature change relative to the initial temperature of the power amplifier, and to cause a gain of the power amplifier to be adjusted based on the compensation signal, the temperature compensation circuit including a multiplier configured to multiply the indication of the temperature change by the temperature coefficient.

2. The power amplifier system of claim 1 wherein the indication of the initial temperature is captured just after the power amplifier is energized.

3. The power amplifier system of claim 1 wherein the indication of the initial temperature is stored in a sample-and-hold circuit.

4. The power amplifier system of claim 1 wherein the temperature compensation circuit is configured to adjust a reference signal based on the compensation signal to provide a bias signal.

5. The power amplifier system of claim 4 wherein the power amplifier is a multi-stage power amplifier, and a first stage of the power amplifier is configured to receive the bias signal to correct for gain drop over time for the power amplifier.

6. The power amplifier system of claim 1 wherein the sampling circuit is configured to sample a value from a temperature sensor to provide the indication of the initial temperature of the power amplifier.

7. The power amplifier system of claim 6 wherein the temperature sensor includes a diode.

8. The power amplifier system of claim 1 wherein the temperature compensation circuit includes a temperature coefficient circuit configured to generate the temperature coefficient based on an indication of average temperature of the power amplifier.

9. The power amplifier system of claim 8 wherein the temperature coefficient circuit includes a first digital register and a second digital register, the temperature coefficient circuit configured to generate the temperature coefficient based on values in the first digital register and the digital second register.

10. A power amplifier system comprising:
a power amplifier configured to amplify a wireless local area network signal;
a sampling circuit configured to capture an indication of initial temperature of the power amplifier when the power amplifier is energized, and
a temperature compensation circuit configured to generate a compensation signal based on a temperature coefficient that is temperature dependent and an indication of temperature change relative to the initial temperature of the power amplifier, and to cause a gain of the power amplifier to be adjusted based on the compensation signal, the temperature compensation circuit including a temperature coefficient circuit that includes a first digital register configured to store a base coefficient value and a second digital register configured to store a value to set a rate of change of the temperature coefficient over temperature, the temperature coefficient circuit configured to generate the temperature coefficient based on an indication of average temperature of the power amplifier, which is based on the values in the first digital register and the digital second register.

11. The power amplifier system of claim 10 wherein the power amplifier and a temperature sensor are implemented on a first semiconductor die and the temperature compensation circuit is implemented on a second semiconductor die.

12. A method of adjusting a gain of a power amplifier, the method comprising:
generating a temperature coefficient based on an indication of average temperature of a power amplifier;
storing an indication of initial temperature of the power amplifier when the power amplifier is energized;
generating a compensation signal based on the temperature coefficient and an indication of a change in temperature of the power amplifier relative to the initial temperature; and
modifying a reference current based on the compensation signal and generating a bias voltage from the modified reference current, the bias voltage provided to a first stage of the power amplifier to adjust a gain of the power amplifier that includes multiple stages.

13. A method of adjusting a gain of a power amplifier, the method comprising:
generating a temperature coefficient based on an indication of average temperature of a power amplifier;
storing an indication of initial temperature of the power amplifier when the power amplifier is energized;
multiplying the temperature coefficient and an indication of a change in temperature of the power amplifier relative to the initial temperature to generate a compensation signal; and
adjusting a gain of the power amplifier based on the compensation signal.

14. A method of adjusting a gain of a power amplifier, the method comprising:
multiplying an indication of average temperature of a power amplifier by a rate to generate a multiplication result and subtracting the multiplication result from a base temperature coefficient to generate a temperature coefficient;
storing an indication of initial temperature of the power amplifier when the power amplifier is energized;
generating a compensation signal based on the temperature coefficient and an indication of a change in temperature of the power amplifier relative to the initial temperature; and
adjusting a gain of the power amplifier based on the compensation signal.

15. The method of claim 14 further comprising capturing the indication of the initial temperature of the power amplifier just after the power amplifier is energized and storing the indication of the initial temperature in a sample and hold circuit.

16. A wireless communication device comprising:
an antenna configured to transmit an amplified radio frequency signal; and
a power amplifier system including a power amplifier configured to provide the amplified radio frequency signal, a sampling circuit configured to capture an indication of initial temperature of the power amplifier when the power amplifier is energized, and a temperature compensation circuit configured to generate a compensation signal based on a temperature coefficient that is temperature dependent and an indication of temperature change relative to the initial temperature of the power amplifier, and to cause a gain of the power amplifier to be adjusted based on the compensation signal, the temperature compensation circuit including a temperature coefficient circuit configured to generate the temperature coefficient based on an indication of average temperature of the power amplifier.

17. The wireless communication device of claim 16 wherein the temperature coefficient circuit includes a first digital register configured to store a base coefficient and a second digital register configured to store a value to set a rate of change of the temperature coefficient over temperature.

18. The wireless communication device of claim 17 wherein the temperature coefficient circuit further includes a multiplier configured to multiply the indication of average temperature of the power amplifier by the value to generate a multiplication result, and a subtractor configured to subtract the multiplication result from the base coefficient.

19. The method of claim 12 further comprising sampling a value from a temperature sensor to provide the indication of the initial temperature of the power amplifier.

20. The method of claim 19 wherein the temperature sensor is a diode.

21. The method of claim 12 wherein the indication of the initial temperature is stored in a sample-and-hold circuit.

* * * * *